July 7, 1970 J. J. CUOMO 3,519,504

METHOD FOR ETCHING SILICON NITRIDE FILMS WITH SHARP EDGE DEFINITION

Filed Jan. 13, 1967 3 Sheets-Sheet 1

INVENTOR
JEROME J. CUOMO

BY John W Armbruster
ATTORNEY

United States Patent Office 3,519,504
Patented July 7, 1970

3,519,504
METHOD FOR ETCHING SILICON NITRIDE FILMS WITH SHARP EDGE DEFINITION

Jerome J. Cuomo, New York, N.Y., assignor to International Business Machines Corporation, Armonk, N.Y., a corporation of New York Filed Jan. 13, 1967, Ser. No. 609,223
Int. Cl. H01l 7/00, 7/44
U.S. Cl. 148—187 14 Claims

ABSTRACT OF THE DISCLOSURE

An arrangement is provided for employing silicon nitride in semiconductor devices as an insulating, passivating and masking material. Sharp edge definition of the pattern of silicon nitride used is obtained by chemical etching employing masks such as molybdenum, tungsten or silicon, the pattern of these masks being etched by photoetching techniques.

Silicon nitride is a superior insulating, passivating and masking material for coating semiconductor materials and layers, but it is difficult to etch in a sharp pattern. Ordinary resist and etchants are ineffective. The problem of so etching the silicon nitride is solved here by means of the present invention in the form of a photoetch technique in which a thin film of tungsten or molybdenum is applied over the silicon nitride and followed by a coating of photoresist over the metal film which then is developed in a pattern of the resist. The tungsten or molybdenum film is then etched in a pattern to expose the underlying silicon nitride and in effect the metal becomes a mask to effectively control the etching of the silicon nitride in a much better fashion than by any resist in the form of polymers. With the metal mask in position, the silicon nitride is etched by concentrated HF or hot concentrated phosphoric acid with sharp edge definition being held because the tungsten or molybdenum metal film is impervious to HF and hot concentrated phosphoric acid, and the metal has a strong bond with the underlying silicon nitride. Another advantage herein is that the tungsten or molybdenum films are relatively free of pin holes which have been found in other films of metal such as chromium and palladium. The metals tungsten or molybdenum are chemically deposited, i.e. from the carbonyls, at about 600° C. in a thickness of about 3000 angstroms over about 4000 angstroms of silicon nitride.

As an alternative to the meal film masking of the silicon nitride there is contemplated here also the use of plain silicon as a mask over the nitride. The silicon nitride film can be applied as a reactive sputtered coat or as a chemically deposited coat. By removal of the reactive species, for example, in reactive sputtering the $N_2$; or in chemical deposition the ammonia and subsituting for this species an inert material such as argon for sputtering and hydrogen for the chemical process, one can deposit, in situ, a very thin layer of silicon which can act as an alternative to the use of the metal masks noted hereinbefore. When the thin film of silicon is so deposited as a mask, then an ordinary photoresist, resist and etchant may be used to shape the silicon as the mask and this is followed by a second stronger etchant directed through the silicon to space the underlying silicon nitride in a sharply defined pattern.

From the foregoing it is apparent that the object of the present invention is generally the shaping of silicon nitride layers and more particularly the provision of a photoetching technique involving the deposition of resist patterns made of molybdenum, tungsten or silicon for coating the underlying silicon nitride in an easily etched pattern which in turn becomes a tough adherent mask making possible the use of strong etchants for quick sharp edge defined cutting of the hard underlying silicon nitride coatings.

When fabricating small electronic devices such as semiconductors, it is desirable to produce sharply defined channels or holes, i.e. for diffusions into the base semiconductor, or openings for raised portions in the various metallic and insulation layers deposited successively on semiconductor surfaces. It is found, particularly in transistor fabrication, that sharply defined areas permits the use of smaller terminal and comb-like electrodes for such uses as emitter and base portions of the transistor with an equal or improved yield in production and improved device characteristics. Also in diode production sharply defined areas allow smaller and more uniform junction areas to be made.

Accordingly it is an object of this invention to produce minute and more sharply defined holes and channels in the insulation, passivation and masking layers on semiconductor bodies and more particularly to produce transistors having more closely spaced electrodes including the bipolar portions of the transistor, and to produce diodes having more sharply defined areas for electrodes and dopant treated areas including PN junctions. Although this invention is particularly explained with respect to silicon semiconductor bodies, it is apparent that it is applicable also to germanium, gallium arsenide, and other semiconductor materials.

Heretofore, silicon nitride and silicon dioxide films have been proposed for protection of semiconductor devices, for masks in the diffusion of carrier types into the base semiconductor, as insulators for metal and cross overs, etc. Photochemical techniques for defining more particularly the silicon nitride areas have been unsatisfactory due to attack of the photoresist by the etchant, poor adhesion in the presence of the etchant resulting in poor definition of the silicon nitride areas, with subsequent poor definition of diffused regions, and poorly defined device regions.

Therefore it is a further object and advantage of this invention to produce metallic and semiconductor masks by the use of photochemical processes and to utilize the same to produce areas of channels and holes of sharply defined configuration and of sizes and shapes independent of mechanical handling techniques and by processes adapted to automation.

The fabrication of suitable holes, channels and electrodes on suitably doped semiconductor wafers according to this invention involves the formation on a predetermined surface of a silicon crystal of a layer or layers of films of silicon nitride and molybdenum or tungsten metal to serve as a surface protective mask during preferential etching of the silicon substrate adjacent the mask thus producing under the mask a pattern of silicon material suitable for subsequent device fabrication. Suitable silicon nitride layers may be formed by depositing silicon in the presence of a nitrogen gas on the semiconductor surface or by decomposing chemicals thereon.

Laminations of films are formed by successively forming films of silicon nitride and metal or silicon film and a photosensitive polymerizable (PSP) material followed by photochemically polymerizing selected portions of the PSP material, removing unpolymerized portions thereof, selectively removing exposed portions of the metal and thereafter of the silicon nitride film to produce on the surfaces of the semiconductor wafer and on the surface of the silicon nitride the metal tungsten or molybdenum films patterns under the polymerized PSP material. It is optional whether the polymerized PSP material is to be removed before etching of the silicon nitride so that it may be removed before the silicon nitride etching step and the etching of the silicon nitride may proceed successively as a single process step.

Silicon nitride has been found to be a very useful insulating, masking and passivating film material for general usefulness in electronic device fabrication. It is considered a better masking material and an excellent diffusion barrier. However, one of the serious problems connected with the use of this material is its chemical inertness. Silicon nitride is relatively unaffected by room temperature acids and alkaline solutions with concentrated HF as an exception. Hot concentrated phosphoric acid also attacks silicon nitride rather slowly. The problem connected with using HF solutions or hot concentrated phosphoric acid is that ordinary photoresists are useless when they are employed. Photoresists can be used in the presence of buffered HF, but then the time consumed to etch a film of ordinary thickness would make the photoresist processing ineffective and uneconomical. The effective and successful use of silicon nitride as an intermediate mask or film is contingent on the provision of a simple but effective method for etching the silicon nitride as a film. The present invention describes such an effective method for etching silicon nitride films with sharp edge definition. The reactive sputtered silicon nitride film or chemical vapor deposited silicon nitride film is here coated with molybdenum, tungsten or similar tough metal films which are easily etched by photoresist techniques and furthermore forms a strong bond with the nitride of the film and becomes impervious to undercutting by the HF acid or the hot phosphoric acid. A pattern is produced in the tungsten or molybdenum film by standard photoresist techniques and etched by potassium ferricyanide and potassium hydroxide solutions. The substrate or wafer which then contains the tungsten or molybdenum film acting as a resist or mask on the area of silicon nitride film which is exposed and then put into an HF solution which is about 2½ minutes is found sufficient to cut through a 4000 angstrom film of silicon nitride with a sharp edge definition. The advantages of using molybdenum or tungsten are that they are strongly adherent, unaffected by concentrated HF, and furthermore of small grain size in films of 1,000 A. range, such that when any small amount of undercutting takes place with the photoresist, such undercutting is very uniform and there still is produced very sharp edges on the metal mask film. The metal can be etched to 3 micron lines with only several microns of spacing, and the silicon nitride opening tolerances are also in the 3 micron range.

Although reference is made here to silicon nitride primarily as the passivating material to be treated, it is evident that other compounds which must be exposed to concentrated etching solutions are also subject to treatment by the disclosed photoetching technique and such compounds include germanium nitride, germanium dioxide, as well as $SiO_2$, GaP, SiC, and the like forms of insulation and particularly with respect to $Ge_3N_4$ which is similar in many respects to $Si_3N_4$.

The metal films may be deposited by vapor plating of molybdenum and tungsten, i.e. from the metal carbonyls. The one type of plating method utilizes the thermal decomposition of molybdenum hexacarbonyl. It is found that when the temperature is increased to above 550° C. an adherent deposit of molybdenum is achieved and the same range of conditions apply as well to the use of tungsten hexacarbonyl. As an etchant for the tungsten film, a composition of 75 grams per liter of potassium ferricyanide to 25 grams per liter of potassium hydroxide serves to etch tungsten films at room temperature. More dilute solutions are recommended for films below 1000 A. The mentioned compositions dissolve the tungsten without leaving a residue and it is important to note that it dissolves any tungsten hardened by carbon without yielding a residue. As an etchant for the molybdenum films, it was found that the same concentrations of potassium ferricyanide and potassium hydroxide serve at room temperature.

As another use involving etching of silicon nitride using the tungsten and molybdenum mask technique it is well to note that when the silicon nitride is on a substrate of gallium arsenide it is possible to etch therein very fine lines of three micron widths with sharp edge definition suitable for use in the fabrication of laser diodes.

Another object of the invention is the provision of a method for depositing silicon as a mask over the insulation layer of silicon nitride. The method as noted hereinbefore involves an alternative of the usage of the metal masks noted and involves the process in which the same chamber used for the chemical vapor deposition of silicon nitride or the sputtering of silicon nitride, is utilized for depositing a silicon layer. The silicon coating so deposited is treated by photoetching processes in the ordinary manner to form a masking pattern which is then used to attach the underlying silicon nitride.

The foregoing and other objects, features and advantages of the invention will be apparent from the following more particular description of the preferred embodiments of the invention, as illustrated in the accompanying drawings.

Figure 1:
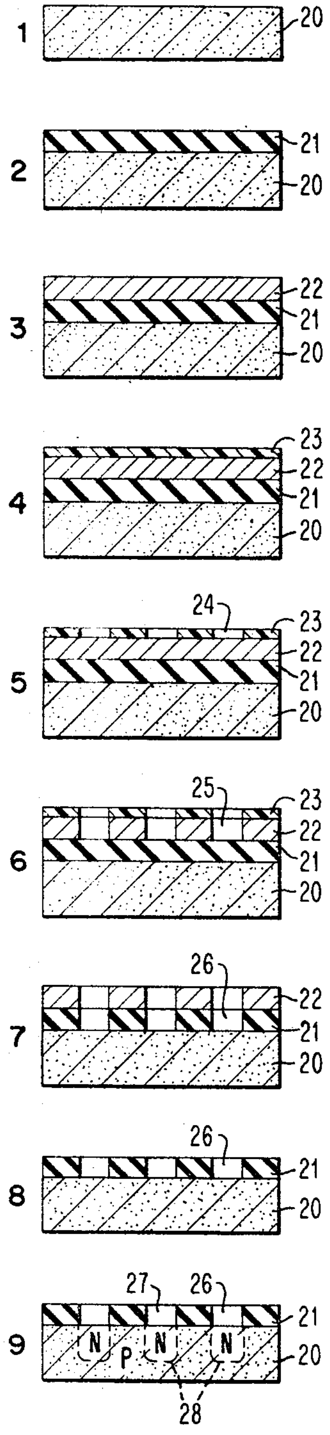
FIG. 1 illustrates nine steps in a sequential process for producing a semiconductor substrate having a silicon nitride mask for governing the diffusion of dopants in a selected pattern.
Figure 2:
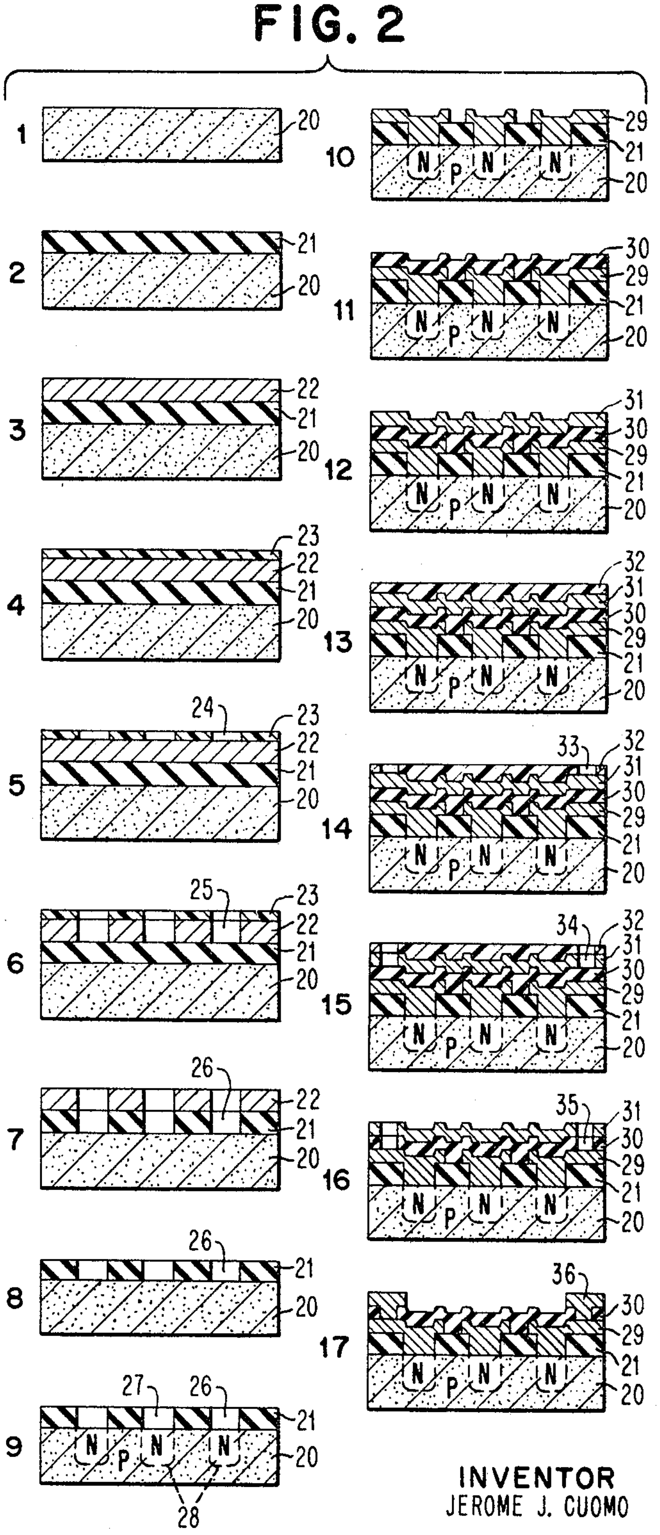
FIG. 2 shows a series of seventeen steps illustrating a further sequential process for fabricating a semiconductor structure involving a plurality of layers of silicon nitride and metallic conductors and terminals.

In FIGS. 1 and 2 the layers of films are formed by successively forming films of silicon nitride, molybdenum or tungsten metal, and photosensitive resist material followed by photochemically exposing selected portions of the resist to remove unpolymerized portions thereof and selectively exposing portions of the molybdenum film and thereafter of the silicon nitride film to produce on the surface layers of the substrate a metal film under the pattern of the resist. The resist material is preferably removed before the etching of the wafer and may be removed before the silicon nitride etching step so that the etching of the silicon nitride and of the treatment of the wafer may proceed successively.

FIG. 1 shows a P type silicon semiconductor wafer 20 upon which a silicon nitride mask 21 is to be formed for selective diffusion of an N type dopant and selected portions of the upper surface of the wafer. Several degreasing and cleaning steps which are well known in the semiconductor fabrication operations are omitted herein for clarity of presentation. In observing the several or nine steps of FIG. 1 it may be well to give a general explanation of each one in sequence. Step number one illustrates the wafer 20 standing alone while step two illustrates the first coating of silicon nitride. Step three illustrates the addition of a metallic or silicon coating which is to act as the resist for the silicon nitride film while step four illustrates the addition of a photoresist 23 which is to determine the shaping of the metal film 22. Step five illustrates the formation of the pattern 24 in the resist 23 while step six illustrates the further penetration as controlled by the outer resist to determine the etched pattern 25 penetrating through the metal resist. Step seven illustrates the usage of a strong concentrated etchant to remove selected portions of the silicon nitride as illustrated by reference numeral 26 showing the cutting of the silicon nitride film and conformity with the pattern previously determined by the cutting of the metal resist. The eighth step illustrates the removal of the metal film to allow the silicon nitride pattern to remain along as the mask for determining the diffusion of the N type dopant as illustrated in the ninth step where it is seen that through the openings 26 the dopant is penetrated into areas 27 also identified as being restricted in areas of penetration as noted by the designation 28 applied to several of the N type doped areas existing below the openings in the silicon nitride mask.

Returning now to observation of step two of FIG. 1 where it is noted that the film 21 is a silicon nitride film which is understood to be established on the surface by any number of processes including a reactive sputtered process. In addition to the sputtered method of depositing the silicon nitride layer we may take note of other alternative processes such as chemical vapor deposited silicon nitride layers.

Following the deposition of the silicon nitride layer 21, then as illustrated in the third step there is deposited a film 22 which is of the group of metals including molybdenum and tungsten or of a pure silicon coating formed as a secondary part of a silicon nitride deposition. However when the coating is formed as a metal it is to be deposited in any one of several forms such as by sputtering or by plasma discharge chemically or by vapor deposition from an entered gas. These various steps are considered more fully hereinafter in conjunction with the explanation of FIGS. 3, 4 and 5.

Turning now to step four of FIG. 1 it is seen that a layer of ordinary photoresist 23 such as any of the KPR, KMER, or similar types of photoresist is added as a layer on top of the metal resist 22. Between steps four and five of the showings in FIG. 1, it is understood that there is an ordinary treatment of the photoresist layer 23 by means of photoetching techniques commonly used in the artwork associated with printed circuits in that a negative is placed over the layer of resist for exposure and subsequent development to form open work patterns such as the openings 24 shown in the fifth step.

In the sixth step the metal layer 22 is to be etched as shown by the openings 25 as governed by the pattern in the outer resist 23. The etching of the molybdenum or tungsten is performed by a potassium ferricyanide and a potassium hydroxide solution. Various combinations of the solutions of nitric, phosphoric acid, acetic acid and $H_2O$ are also effective in cutting through such metallic resist coatings.

The seventh step shows that there is a removal of the outer photoresist 23 and etching of the underlying silicon nitride film 21 by the use of a concentrated hydrofluoric acid which is resisted by the molybdenum or tungsten resist and permitted to penetrate to remove selected portions of the silicon nitride masking material. This is followed by the removal of the metal resist as shown in the eighth step and the mask 21 is then ready to perform the diffusion control function which was sought originally by the deposition of the silicon nitride. In the ninth step it is shown that through the openings 26 in the silicon nitride film 21 the dopants of the N character as shown here is inserted as portions 27 to effect the regions 28 in the silicon substrate 20. Although illustrated here in connection with P type silicon as a substrate it is obvious that the dopant arrangements may be reversed and also obvious that materials other than silicon, such as germanium, gallium arsenide, or any semiconductor material may be utilized as the underlying substrate to receive the silicon nitride mask as part of a fabricating step.

Although in FIG. 1 the silicon nitride fabricating step is illustrated in conjunction with the use of the insulator as a mask, it will be realized that the silicon nitride treatment by successive etchant steps, as illustrated, it is also useful for the use of the silicon nitride film as an insulator and also as an outer passivating coating in addition to the masking technique used as the illustration in FIG. 1. For example in FIG. 2 there are a greater number of steps illustrated to point out that the silicon nitride film may be employed in a plurality of layers to control not only the doping but also the separating of various metallic layers such as those for electrodes and terminals of semiconductor and diode formations as well as other electronic devices.

In FIG. 2 the first nine steps coincide exactly with the procedures followed in FIG. 1 for the formation of the preliminary part of a semiconductor. In FIG. 2 the steps ten to seventeen inclusive provide additional coatings and photoetch technique steps for the employment of several coatings to form electrode and terminal structures on the semiconductor device. For example step ten is concerned with the addition of the metallic layer 29 which is coated over the previously formed pattern of the silicon nitride layer 21. This is followed in step eleven by the deposition of a secondary silicon nitride coating 30 which covers all of the terminal metal 29 which may be nickel, chromium, or any of the other conductive metals compatible with the etchants used, including tungsten and molybdenum. The twelfth step is concerned with the addition of another layer 31 which is also of a metal character and may comprise selective conductive metal and one of the group including tungsten and molybdenum. This twelfth step is followed by the addition of a photoresist coat 32 as shown in the thirteenth step and it is understood that this photoresist 32 may be of the same character and for the same purpose as the coating 23 shown in the fourth step originally. The fourteenth step shows by the openings 33 that the resist is photoetched to develop a pattern which is to control the underlying metal to be removed as shown in the fifteenth. The fifteenth step shows openings 34 cut into the secondary metal contact material 31 which was deposited in the thirteenth step. The cutting of the control resist metal pattern is followed by removal of the outer resist 32 as shown in the sixteenth step which also includes the etching as illustrated by hole 35 cutting through the silicon nitride deposit 30 which is superimposed on the first metal coating. The sixteenth step is followed by the removal of the metal film resist 31 and the substitution therefor of a terminal metal 36 which is deposited through a pattern or added by photoetch technique to form terminals which penetrate through the secondary silicon nitride film 30 to provide contact with the underlying electrode material 29 previously formed. Thus it i apparent by the seventeen steps shown outlined in FIG. 2 that a plurality of silicon nitride films may be employed for both masking, insulating and passivating a series of electrode and terminal formations in the fabrication of an electronic device.

It is understood with reference to FIGS. 1 and 2 that the silicon nitride films deposited therein are to be in the range of thickness from 400 to 10,000 angstroms and the superimposed metallic or silicon film deposited thereon as a resist is to range in the thickness from 400 to 10,000 angstroms. It has been found that very clearly defined side walls and pattern apertures are possible to be formed in any silicon nitride films by the use of the metallic resist shown.

Figure 3:
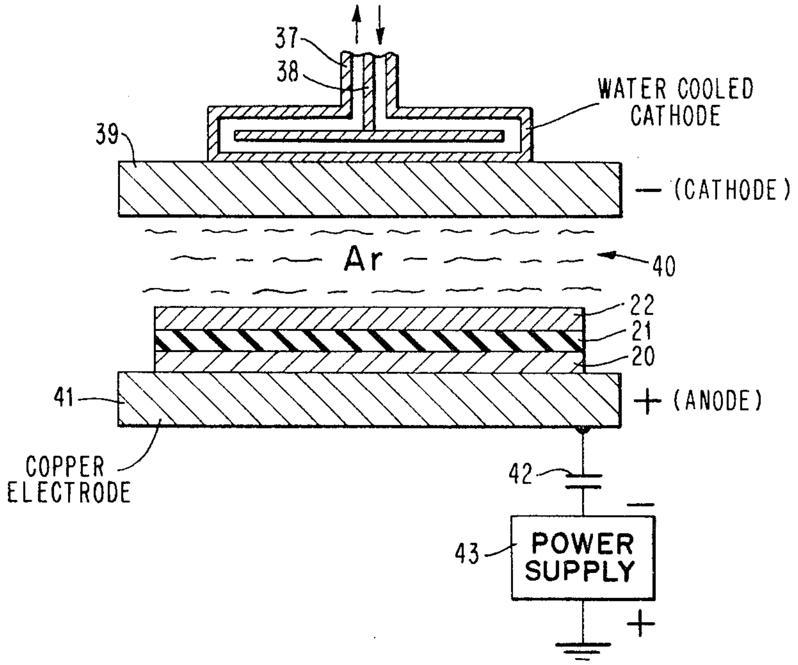
FIG. 3 is a schematic showing of the means for sputtered deposition of molybdenum or tungsten.

In FIG. 3 there is shown in a diagrammatic fashion a sputtered deposition apparatus for applying the metallic resist coats to the silicon nitride film on a semiconductor. At the lower part of the figure it is seen that the anode is negatively biased by a power supply 43 through a capacitor 42 connected to the underside of the copper electrode 41. Resting upon electrode 41 is the semiconductor wafer 20 already formed with the silicon nitride layer 21 and having a partially completed metallic coating 22 of molybdenum or tungsten which is sputtered off the cathode and through an argon atmosphere or region 40. The cathode includes an upper water cooled electrode comprising an outer frame 37 and an inner electrode 38 formed with hollow spaces through which water may be circulated to serve to cool the material emitting cathode which has an extending electrode 39 formed of tungsten or molybdenum.

Figure 4:
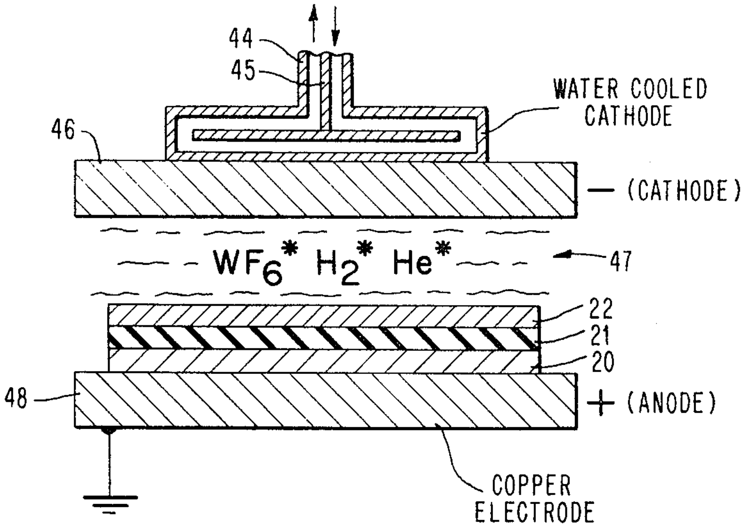
FIG. 4 is a diagrammatic showing, illustrating the plasma discharge mode of chemical vapor deposition of molybdenum or tungsten.

FIG. 4 shows an alternative form of apparatus wherein a plasma discharge of chemical vapor deposition causes the deposit of the metallic resist on the substrate. Here it is shown that the anode in the lower part of the view is a copper electrode 48 which is grounded. Resting upon the electrode 48 is the semiconductor wafer 20 already bearing the silicon nitride film 21 and a partially formed metallic resist film 22 which is deposited by the reaction of metal off the cathode 46 which is formed by molybdenum of tungsten and predominantly from the gases entered in the interval as illustrated by space 47, said gases being in a highly excited state, i.e. $WF_6^* + H_2^* + He^*$ as illustrated at the right. These gases are employed to accelerate the deposition rate of the metals; it also allows the lowering of the substrate temperature on which this deposition is taking place. The cathode is formed as a water cooled apparatus 44 and 45 formed with the outer negative electrode 46 comprising the metallic component to be deposited on the silicon nitride layer.

Figure 5:
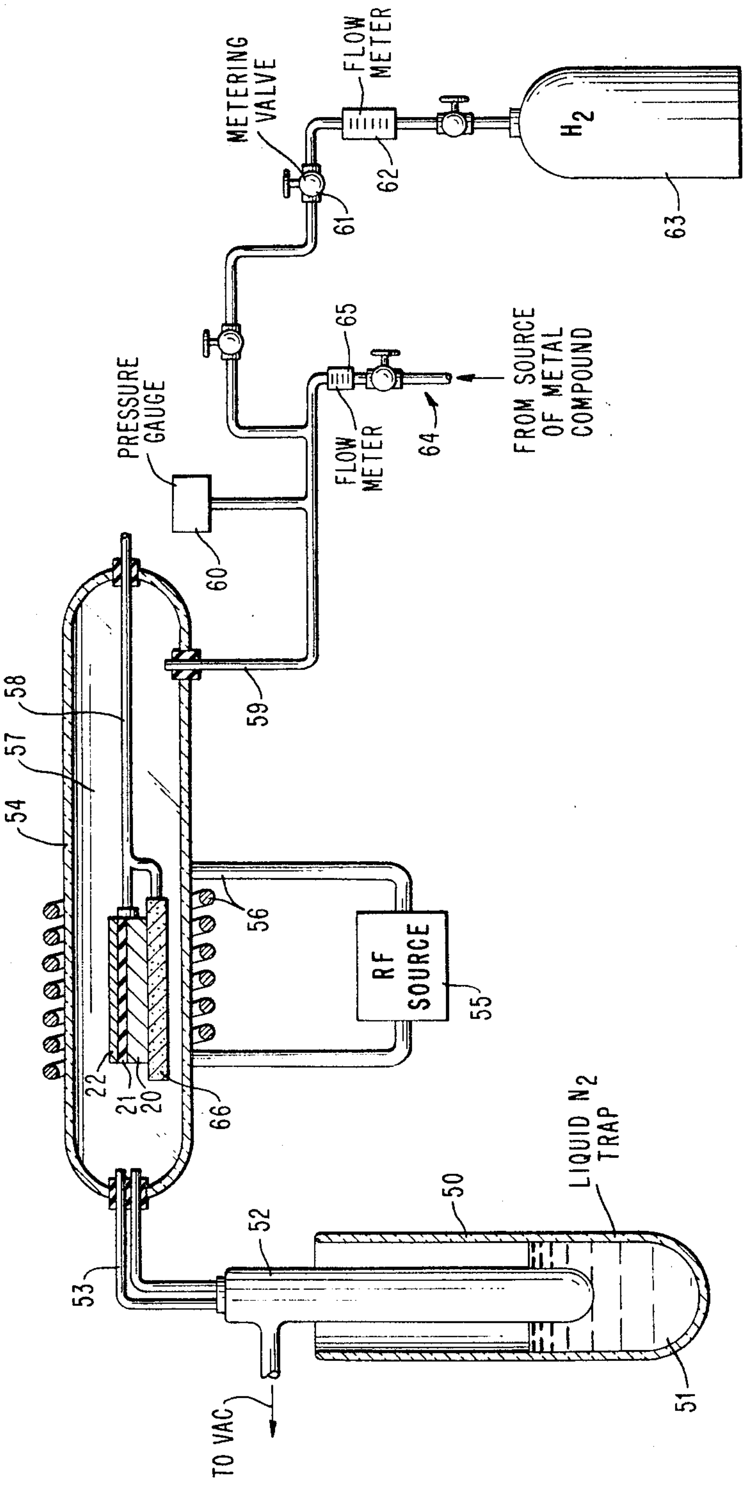
FIG. 5 is a front elevation partly in section of an apparatus for chemical vapor deposition aspect of the invention.

FIG. 5 shows a chemical vapor deposition apparatus for depositing the metallic resist by the pyrolysis or chemical reduction of the metallic compound. A holder 63 contains the reduction gas $H_2$ which is directed through a flow meter 62 and a metering valve 61 and carries along with it through the input source piping 64 any one of several metallic gas compositions through flow meter 65 as governed by the pressure gauge 60 to be directed through the inlet 59 into the heated chamber 54. In the chamber is a graphite susceptor 66 which serves as internal heating source, and there is also the thermal couple 58 which indicates the internal temperature. The metal compound applied to the inlet 64 may take the form of molybdenum or tungsten hexacarbonyl, molybdenum or tungsten pentachloride, or tungsten hexafluoride. These compositions when entered into the chamber 57 are deposited as a chemically reduced film 22 on the silicon nitride surface 21 of the semiconductor wafer 20. An RF source 55 is formed with a coil surrounding the chamber 54. The gases are exhausted through piping 53 and through a chamber 52 leading to a vacuum source, said chamber 52 being immersed in a liquid $N_2$ trap 51 held in a container 50. The working parameters of the apparatus of the kind shown in FIG. 5 involves a susceptor 66 temperature of from 450° C. to 600° C. and a time of deposition from 1 to 30 minutes for a tungsten or molybdenum coating 22 of a thickness from 400 to 10,000 angstroms.

While the invention has been particularly shown and described with reference to preferred embodiments thereof, it will be understood by those skilled in the art that various changes in form and details may be made therein without departing from the spirit and scope of the invention.

What is claimed is:

1. A method for producing a sharply defined pattern of insulation on a substrate, comprising the steps of:

forming a first film of silicon nitride on the surface of said substrate, forming a second film of a metal from the group consisting of molybdenum and tungsten which is selectively etched without affecting the silicon nitride, and which resists etchants for the silicon nitride and the substrate, forming a third film of photosensitive resist material on said second film, exposing a pattern of said third film to light to polymerize a pattern thereof, developing said third film to remove the unpolymerized portion of said pattern, selectively removing a pattern of said second film of metal uncovered by said developing, and removing the same pattern of said first film of silicon nitride uncovered by removal of said pattern of said second film of metal.

2. A method of the kind set forth in claim 1 wherein said film of a metal such as molybdenum or tungsten is formed on said film of silicon nitride by contacting the silicon nitride with a gas stream containing a vapor of said metal under reaction conditions of elevated temperature sufficient to cause deposit of the reduced metal as an adherent coating on said silicon nitride.

3. A method of the kind set forth in claim 2 wherein said temperature is in the range of 100° C. to 800° C. and said metallic vapors are of the gases $Mo(CO)_6$, $W(CO)_6$, $MoCl_5$, $WCl_5$, or $WF_6$.

4. A method of the kind set forth in claim 1 wherein concentrated HF acid is used as an etchant in said removing of silicon nitride.

5. A method of the kind set forth in claim 1 wherein hot concentrated phosphoric acid is used as an etchant in said removing of silicon nitride.

6. A method of the kind set forth in claim 1 involving the further steps of repeating the steps for forming patterns of silicon nitride and metal, whereby a series of a plurality of patterns of insulation and metal are fabricated on said substrate.

7. A method of the kind set forth in claim 6 including the further step of forming terminal contacts to said metal.

8. A method of the kind set forth in claim 1 wherein said substrate is of semiconductor material, said pattern of silicon nitride serves as a diffusion mask thereon, and the exposed areas of said substrate are treated with a diffused dopant.

9. A method of the kind set forth in claim 1 wherein the step of forming the film of silicon nitride involves pyrolytic deposition.

10. A method of the kind set forth in claim 1 wherein the step of forming the film of silicon nitride involves reactive sputtering of silicon in the presence of a nitrogenous gas.

11. A method of the kind set forth in claim 1 wherein said film of metal such as molybdenum or tungsten is formed on the silicon nitride by a step of sputtered deposition.

12. A method of the kind set forth in claim 1 wherein said film of metal such as molybdenum or tungsten is formed on the silicon nitride by a plasma discharge mode of chemical vapor deposition.

13. A method of the kind set forth in claim 1 wherein said film of a metal such as molybdenum or tungsten is formed on the silicon nitride by the step of chemical vapor deposition of hydrogen and molybdenum hexacarbonyl, molybdenum pentachloride, tungsten hexacarbonyl, tungsten pentachloride or tungsten hexafluoride.

14. A method of the kind set forth in claim 1 wherein said silicon nitride forming step is controlled to deposit a film of thickness of from 400 to 10,000 angstroms, and said metal film forming step is controlled to deposit a metal film of a thickness of from 400 to 10,000 angstroms.

References Cited

UNITED STATES PATENTS

| | | | |
|---|---|---|---|
| 3,122,450 | 2/1964 | Barnes | 117—217 |
| 3,165,430 | 1/1965 | Hugle | 148—187 |
| 3,193,418 | 7/1965 | Cooper | 148—187 |
| 3,350,222 | 10/1967 | Ames | 117—217 |
| 3,382,099 | 5/1968 | Montmory | 117—217 |
| 3,402,081 | 9/1968 | Lehman | 148—185 |
| 3,406,050 | 10/1968 | Shortes | 148—185 |

L. DEWAYNE RUTLEDGE, Primary Examiner

R. A. LESTER, Assistant Examiner

U.S. Cl. X.R.

117—201, 215, 217, 227; 148—185; 156—17